(12) United States Patent
Rohleder et al.

(10) Patent No.: US 9,152,511 B2
(45) Date of Patent: Oct. 6, 2015

(54) SYSTEM FOR DYNAMICALLY DISTRIBUTING AN AVAILABLE MEMORY RESOURCE TO REDUNDANT AND NON-REDUNDANT STORAGE AREAS USING RAM ROUTING LOGIC

(75) Inventors: Michael Rohleder, Unterschleissheim (DE); Gary Hay, Motherwell (GB); Stephan Mueller, Taunusstein (DE); Manfred Thanner, Neubiberg (DE)

(73) Assignee: Freescale Semiconductor, Inc., Austin, TX (US)

( * ) Notice: Subject to any disclaimer, the term of this patent is extended or adjusted under 35 U.S.C. 154(b) by 756 days.

(21) Appl. No.: 12/995,317

(22) PCT Filed: Jun. 20, 2008

(86) PCT No.: PCT/IB2008/052448
§ 371 (c)(1),
(2), (4) Date: Nov. 30, 2010

(87) PCT Pub. No.: WO2009/153624
PCT Pub. Date: Dec. 23, 2009

(65) Prior Publication Data
US 2011/0082970 A1    Apr. 7, 2011

(51) Int. Cl.
*G06F 11/16* (2006.01)
*G11C 29/26* (2006.01)
(Continued)

(52) U.S. Cl.
CPC .......... *G06F 11/1666* (2013.01); *G06F 11/167* (2013.01); *G11C 29/74* (2013.01);
(Continued)

(58) Field of Classification Search
CPC .............. G06F 11/1666; G06F 11/167; G06F 11/1629; G06F 2212/1032
See application file for complete search history.

(56) References Cited

U.S. PATENT DOCUMENTS 5,283,877 A    2/1994 Gastinel et al.
5,495,570 A    2/1996 Heugel et al.
(Continued)

FOREIGN PATENT DOCUMENTS

EP    0709782 A    5/1996
EP    1054326 B1    10/2003
(Continued)

OTHER PUBLICATIONS

Tremaine et al, "IBM Memory Expansion Technology (MXT)," IBM Journal of Research and Development, vol. 45, No. 2, Mar. 2001, pp. 271-285.*

(Continued)

*Primary Examiner* — Sanjiv Shah
*Assistant Examiner* — Glenn Gossage

(57) ABSTRACT

A system for distributing an available memory resource comprising at least two random access memory (RAM) elements and RAM routing logic. The RAM routing logic comprises configuration logic to dynamically distribute the available memory resource into a first memory area providing redundant memory storage and a second memory area providing non-redundant memory storage. The system may further comprise bus access ports which support at least one of concurrent access by a bus access port to access redundantly stored data or non-redundantly stored data, or concurrent access by at least two bus access ports to respective RAM elements to access redundantly stored data or to a respective one of the RAM elements to access non-redundantly stored data. Comparison logic and error detection or correction logic may be provided to detect or correct errors in information read from the RAM elements.

20 Claims, 7 Drawing Sheets

(51) Int. Cl.
*G11C 29/00* (2006.01)
*G11C 7/10* (2006.01)
*G11C 29/04* (2006.01)

(52) U.S. Cl.
CPC ....... *G06F11/1629* (2013.01); *G06F 2201/845* (2013.01); *G11C 7/1075* (2013.01); *G11C 2029/0411* (2013.01)

(56) References Cited

U.S. PATENT DOCUMENTS

| | | | |
|---|---|---|---|
| 6,510,527 | B1 | 1/2003 | Woerner et al. |
| 6,823,411 | B2 * | 11/2004 | Hofmann et al. ............. 710/110 |
| 6,901,552 | B1 | 5/2005 | Fey et al. |
| 6,959,400 | B2 | 10/2005 | Peleska |
| 2005/0138465 | A1 | 6/2005 | Depew et al. |
| 2006/0218432 | A1 | 9/2006 | Traskov et al. |
| 2007/0030611 | A1 * | 2/2007 | Cho et al. .......................... 361/58 |
| 2008/0271054 | A1 * | 10/2008 | Allison et al. ................ 719/319 |
| 2010/0287443 | A1 * | 11/2010 | Rohleder et al. ............. 714/758 |

FOREIGN PATENT DOCUMENTS

| | | |
|---|---|---|
| EP | 1703400 A | 9/2006 |
| WO | 2009/153623 A1 | 12/2009 |

OTHER PUBLICATIONS

Lavoie Jeromie: "IBM Memory Expansion Technology" Weblink: http://www.research.ibm.com/journal/rd/452/tremaine.html, pp. 1-16.

Lai Anthony: "Mitigation Techniques for Electronics in Single Event Upset Environments" Weblink: www.mil-embedded.com/articles/authors/lai/, Jan. 25, 2006, pp. 1-8.

Tezzaron Semiconductor: "Soft Errors in Electronic Memory-A White Paper" Tezzaron Semiconductor, 1415 Bond Street, Suite 111, Naperville, IL, 60563, Version 1.1, Jan. 5, 2004, pp. 1-7.

Maiz Jose et al: "Characterization of Multi-bit Soft Error Events in Advanced SRAMs" IEEE International Electronic Device Meeting, Dec. 2003, pp. 519-522.

International Search Report and Written Opinion correlating to PCT/IB2008/052448 dated Mar. 10, 2009.

* cited by examiner

SYSTEM FOR DYNAMICALLY DISTRIBUTING AN AVAILABLE MEMORY RESOURCE TO REDUNDANT AND NON-REDUNDANT STORAGE AREAS USING RAM ROUTING LOGIC

FIELD OF THE INVENTION

The field of the invention relates to a system for distributing an available memory resource, and more particularly to a system for distributing an available memory resource comprising random access memory (RAM) elements.

BACKGROUND OF THE INVENTION

Safety requirements for automotive electronics are being standardized in a number of application segments. An example of application segments includes chassis applications, which United States government legislation requires to be standardized for each new vehicle from 2012. A further example is electric power steering.

Automotive braking applications and steering applications also both require sophisticated electronic solutions that allow switching to a safe state in case a malfunction is detected. Accordingly, awareness of safety issues, for example by a system-on-chip (SoC), is of increasing importance in today's vehicular applications, although the usage of such devices is not limited to such applications. However, the safety level required differs from application to application. For example, some applications may require Safety Integrity Level (SIL) 3, whilst other applications may require SIL 2. Safety Integrity Levels (SIL) are defined as a relative level of risk-reduction provided by a safety function, or as a specific target level for risk reduction. Four SIL levels are defined by the International Standard IEC 61508, ranging from SIL 4, being the most dependable, to SIL 1, being the least dependable.

Different levels of safety may require varying amounts of redundancy of building blocks and connectivity within the SoC. As a result of this, known SoCs are designed with a specific SIL in mind. However, the need to develop multiple SoC architectures to support multiple SILs makes the development of safety aware devices complex and costly.

One particular area of importance for such SoCs is the Random Access Memory (RAM) provided on the SoC, which is a major contributor for possible failure conditions within the performance of the SoC. Since redundancy of a building block such as RAM within SoCs is typically tightly coupled to the architecture of the SoC and the application intended to run thereon, this is an issue for creating a family of safety aware devices.

Redundant storage elements are an important feature of a safety aware system. The rising importance of safety issues makes them a key element for any future application. Unfortunately, redundancy in this context is an expensive feature, since the memories within a SoC typically occupy more than fifty percent of the die size. The impact of doubling the required integrated circuit real estate to implement redundant storage on the overall system cost is therefore significant.

Redundancy of data stored in random access memories (RAM) is not always required, and for many applications it is sufficient to use a non-redundant RAM for the storage of less critical information. However, it is nearly impossible to accurately determine in advance the ratio between redundant RAM and non-redundant RAM required by a certain application. Since the need for safety features differs from application to application, it is highly desirable to only implement redundant memory up to the level required by the actual application.

However, the cost of integrated circuit (IC) mask sets is constantly increasing, and is a significant cost in the development of SoCs. Typical publications in this field discuss a cost factor of about US$1 million for a single mask set for 90 nanometer (nm) devices. Consequently, the need to develop multiple SoC architectures to support multiple SILs is becoming an obstacle to the development of safety aware devices, since only devices that can be sold in high volumes are cost effective to be fabricated. Thus, for applications requiring different levels of safety, different SoCs must be developed. Since redundancy of the building blocks is usually tightly coupled to the architecture of the SoC, this is an issue for creating a family of safety aware devices.

In the future, the production of cost effective devices for safety aware applications will require the ability of such devices to support a wide range of applications. Each application will have its own trade-off between redundant building blocks and the performance level made possible.

SUMMARY OF THE INVENTION

Embodiments of the invention provide a system for distributing available memory, and a semiconductor device comprising such a system, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF EMBODIMENTS

Figure 1:
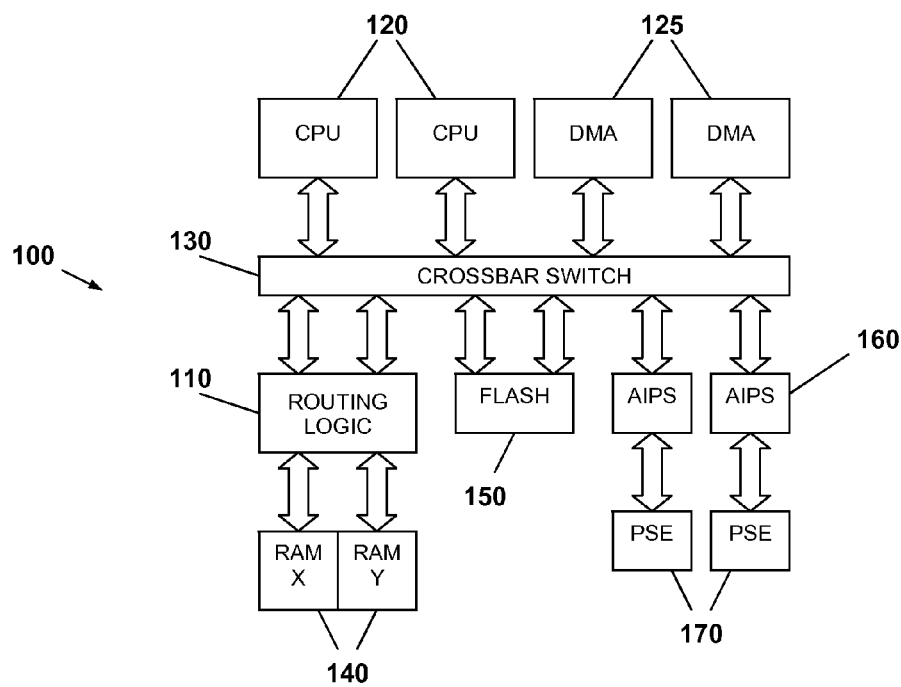
FIG. 1 illustrates an example of a system architecture.

Embodiments of the invention will be described in terms of a memory interface for a random access memory (RAM), within a system-on-chip (SoC) comprising one or more bus master devices, with a focus on safety aspects. Although embodiments of the invention will be described in terms of a system-on-chip (SoC), it will be appreciated that the embodiments herein described may be applied to any apparatus that incorporates a random access memory that can be accessed by one or more bus master devices.

In summary, there is proposed a system for distributing available memory resource comprising at least two random access memory (RAM) elements and RAM routing logic, wherein the RAM routing logic comprises configuration logic to dynamically distribute, with a very fine granularity, the available memory resource into a first memory area providing redundant memory storage and a second memory area providing non-redundant memory storage.

Most safety architectures have differing needs for redundant storage, and often the related requirements are changing over time. Having the capability to specify the ratio between redundant and non-redundant memory during code development or code maintenance, preferably by software, will enable the software developer to use the same SoC architecture for multiple safety applications. As a result the capability to dynamically configure the RAM distribution as described herein will support development of less expensive devices due to economies of scale.

System architectures for safety aware applications may consist of fully, or nearly fully, redundant systems, comprising two systems working concurrently in lock-step mode, whereby operations of the two systems are compared and validated on a cycle-by-cycle basis. Such system architectures perform two concurrent memory accesses, both systems addressing the same memory content, which is stored redundantly.

Alternatively, system architectures may provide multiple bus master elements, which may operate redundantly or independently with respect to one another, permitting a trade-off between safety and performance aspects. Dependent on the actual configuration, when operating redundantly, these system architectures may perform concurrent, redundant lock-step accesses as described above, or single accesses that are replicated externally to achieve a redundant storage. Conversely, when operating independently, these system architectures require the ability to perform two or more different accesses concurrently, addressing different memory content. Accordingly, system architectures may be required to support at least one from a group of:

(i) Concurrent access by at least one bus master element to at least two memory elements in order to access redundantly stored data;

(ii) Concurrent access by at least two bus master elements, operating redundantly with respect to one another, to at least two memory elements in order to access redundantly stored data;

(iii) Concurrent access by at least two bus master elements, operating redundantly with respect to one another, to at least two memory elements in order to access non-redundantly stored data; and (iv) Concurrent access by at least one bus master element to a respective one of at least two memory elements in order to access non-redundantly stored data.

Furthermore, additional embodiments of the invention propose a system for safety applications that provide increased availability in a case of storing the data redundantly. When reading from the at least two random access memory (RAM) elements, the RAM routing logic comprises configuration logic to dynamically identify a faulty RAM content and select a correct or corrected value based on information delivered from additional error detection or error correction logic.

Referring now to FIG. 1, there is illustrated system architecture 100 adapted according to an embodiment of the invention. The system architecture 100 comprises bus master elements, which for the embodiment illustrated in FIG. 1 are in a form of Central Processing Units (CPU) 120 and Direct Memory Access (DMA) controllers 125. The system architecture 100 further comprises a communication element, which for the illustrated embodiment is in a form of a crossbar switch 130, arranged to operably couple CPUs 120 and DMA controllers 125 to a plurality of slave elements. For the embodiment illustrated in FIG. 1, the system architecture 100 comprises slave elements in a form of Random Access Memory (RAM) elements 140, FLASH memory elements 150, and an AIPS (AHB to IP Sky Blue) bus bridge 160, via which peripheral slave elements (PSE) 170 may be operably coupled to the bus master elements over the crossbar switch 130. As will be appreciated by a skilled artisan, a bus bridge 160 is only required when the communication protocol used by the crossbar switch 130, and the protocol used by the peripheral slave elements 170, do not match. In this manner, the bus bridge 160 may be omitted when both master and peripheral slave elements use the same protocol.

The system further comprises RAM routing logic 110, operably coupled between the crossbar switch 130 and the RAM elements 140. The RAM routing logic 110 is arranged to distribute available RAM resource into a first memory area providing redundant memory storage and a second memory area providing non-redundant memory storage.

Figure 2:
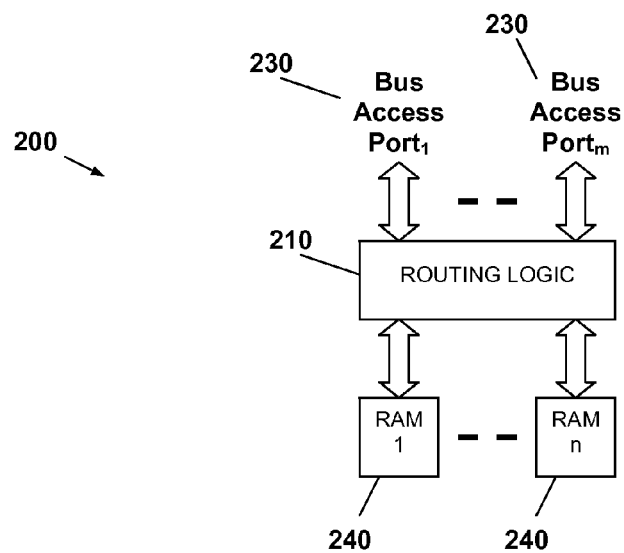
FIG. 2 illustrates an example of a system for distributing available memory resource.

FIG. 2 illustrates a system 200 for distributing available memory resource according to some embodiments of the invention. The system comprises at least two random access memory (RAM) elements 240, and RAM routing logic 210 arranged to dynamically distribute the available memory resource into a first memory area providing redundant memory storage and a second memory area providing non-redundant memory storage. The RAM routing logic 210 is operably coupled to one or more bus access ports 230 of, for example, a crossbar switch or other communication element via which master elements may access the RAM elements 240. As will be appreciated, such a RAM routing logic 210 can be built supporting nearly arbitrary amounts of 'm' bus access ports 230 and 'n' random access memory (RAM) elements; where 'm' and 'n' can be differing numbers.

Figure 3:
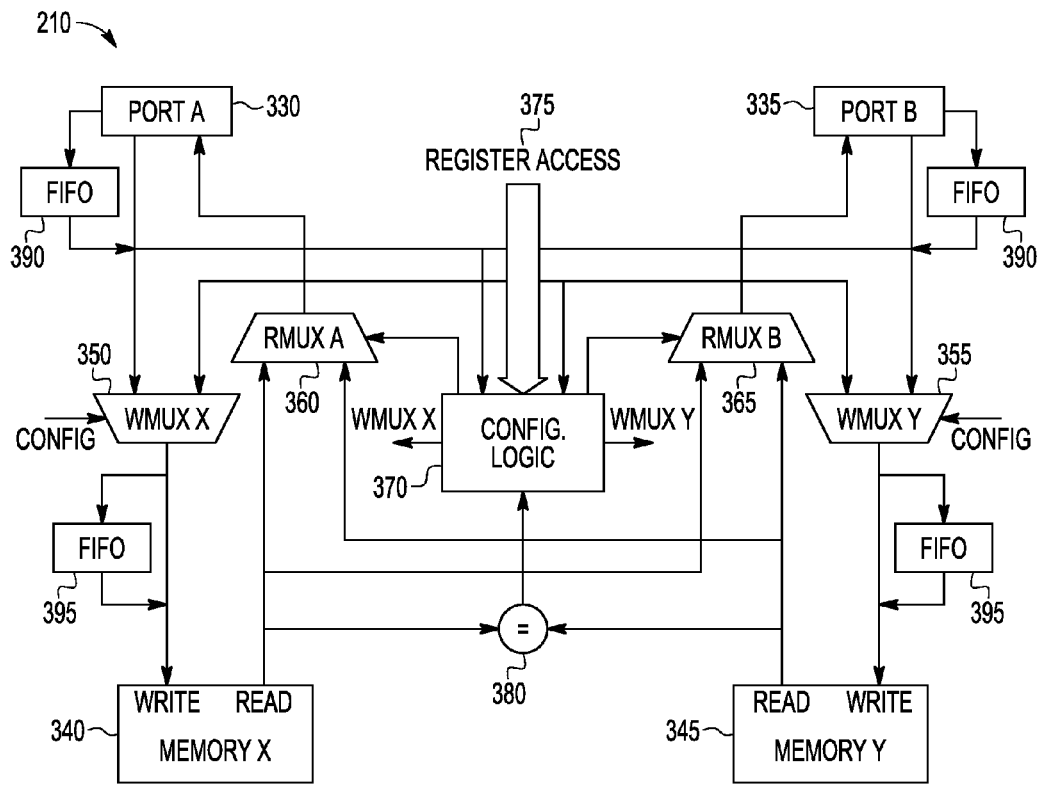
FIGS. 3 to 8 illustrate exemplary configurations of RAM routing logic of the system of FIG. 2.

Referring now to FIG. 3, there is illustrated RAM routing logic 210 supporting two Bus Access Ports and two random access memory (RAM) elements according to some embodiments of the invention. For the embodiment illustrated in FIG. 3, the RAM routing logic 210 is operably coupled to a first bus access port, Port 'A' 330, and a second bus access port, Port 'B' 335, of a communication element, such as a crossbar switch or the like. The RAM routing logic 210 is further operably coupled to two memory elements, Memory 'X' 340 and Memory 'Y' 345.

The RAM routing logic 210 comprises two write multiplexers, WMUX 'X' 350 and WMUX 'Y' 355. An output of each of the write multiplexers, WMUX 'X' 350 and WMUX 'Y' 355, is operably coupled to a write port of one of the memory elements, Memory 'X' 340 and Memory 'Y' 345 respectively. In this manner, the RAM routing logic 210 comprises a write multiplexer for each memory element coupled thereto. An output of each of the bus access ports, Port 'A' 330 and Port 'B' 335, is operably coupled to an input of each write multiplexer, WMUX 'X' 350 and WMUX 'Y' 355.

The RAM routing logic 210 further comprises two read multiplexers, RMUX 'A' 360 and RMUX 'B' 365. An output of each of the read multiplexers, RMUX 'A' 360 and RMUX 'B' 365, is operably coupled to an input of one of the bus access ports, Port 'A' 330 and Port 'B' 335 respectively. In this manner, the RAM routing logic 210 comprises a read multiplexer for each bus access port coupled thereto. A read port of each of the memory elements, Memory 'X' 340 and Memory 'Y' 345, is operably coupled to an input of each read multiplexer, RMUX 'A' 360 and RMUX 'B' 365.

The RAM routing logic 210 comprises configuration logic 370, arranged to dynamically distribute available memory resource into a first memory area providing redundant memory storage and a second memory area providing non-redundant memory storage. Accordingly, for the embodiment illustrated in FIG. 3, the configuration logic 370 is operably coupled to, and arranged to control the configuration of, each of the read multiplexers, RMUX 'A' 360 and RMUX 'B' 365, and the write multiplexers, WMUX 'X' 350 and WMUX 'Y' 355. The configuration logic 370 is further operably coupled to the outputs of the bus access ports, Port 'A' 330 and Port 'B' 335, and arranged to receive memory access request information therefrom. In this manner, the configuration logic 370 receives information relating to access requests, such as read and write requests, received on Port 'A' 330 and Port 'B' 335, and is able to dynamically configure the multiplexers 350, 355, 360, 365 in response to received access requests, and in accordance with, for example, an operating mode in which the RAM routing logic 210 has been configured to operate. For this purpose, the behaviour of the configuration logic 370 may be controlled by software, for example by altering internal registers (not shown) within the configuration logic 370 via a register access port 375.

For the illustrated embodiment, the RAM routing logic 210 further comprises comparator logic 380, operably coupled to the read ports of the memory elements, and arranged to compare information accessed from the memory elements. An output of the comparator logic 380 is provided to the configuration logic 370. In this manner, the comparison logic 380 is able to provide an indication to the configuration logic 370 in response to determining that the comparison of accessed information does not yield a match.

Figure 4:
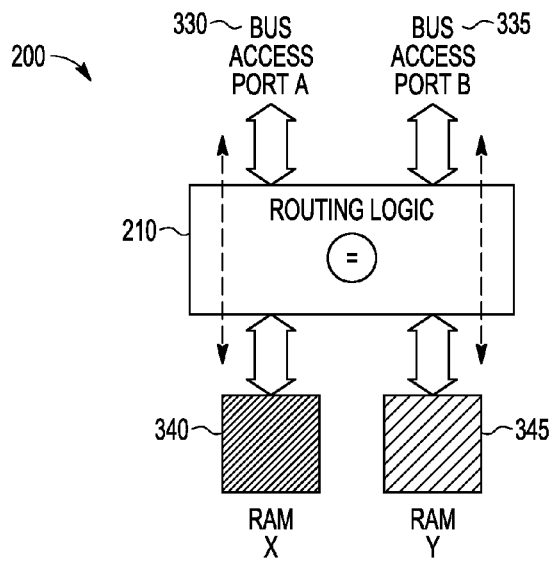

Referring now to FIG. 4, there is illustrated the RAM routing logic 210 configured to support concurrent access to the two memory elements 340, 345 via the two bus access ports, Port 'A' 330 and Port 'B' 335, in order to access redundantly stored data. For example, bus master elements, such as CPUs 120, may be configured to operate in 'lock-step' mode, whereby the master elements perform equivalent operations, cross-checking each other's operations. Thus, concurrent accesses are performed via the two respective bus access ports 330, 335. In this configuration, redundancy may be provided for both bus master resources and memory resources, thereby providing a high safety level throughout the system.

For the operation illustrated in FIG. 4, the RAM routing logic 210 concurrently receives separate but equivalent read and write requests for the memory elements, Memory 'X' 340 and Memory 'Y' 345, via bus access ports, Port 'A' 330 and Port 'B' 335 respectively. The access requests may be validated to be equivalent, and corresponding accesses may then be performed by the RAM routing logic 210 to the two memory elements 340 and 345 concurrently, thereby resulting in redundant storage of data in the two memory elements 340, 345. For this purpose, the first bus master element reads and writes to Memory 'X' 340 via Port 'A' 330, whilst the second bus master element performs corresponding read and write operations to Memory 'Y' 345 via Port 'B' 335.

Referring back to FIG. 3, when the RAM routing logic 210 is operating to provide redundant memory storage in a redundantly working system as illustrated in FIG. 4, the configuration logic 370 configures WMUX 'X' 350 and RMUX 'A' 360 to operably couple the output and input of Port 'A' 330 to the write and read ports of Memory 'X' 340 respectively, as required for write and read requests received on Port 'A' 330. Similarly, the configuration logic 370 configures WMUX 'Y' 355 and RMUX 'B' 365 to operably couple the output and input of Port 'B' 335 to the write and read ports of Memory 'Y' 345 respectively, as required for write and read requests received on Port 'B' 335. In this manner, Port 'A' 330 provides access exclusively to Memory 'X' 340, whilst Port 'B' 335 provides access exclusively to Memory 'Y' 345. Thus, since the master elements are operating in lock-step' mode, and thereby executing the same instructions, the same information will be written to, and read from, the memory elements 340, 345 consecutively. As a result, the memory elements 340, 345 provide redundant storage for the data provided by the system.

In accordance with some embodiments of the invention, the configuration logic 370 may validate that the access requests received at both bus access ports 330 and 335 are equivalent. Accordingly, the RAM routing logic 210 may provide an error status to, say, the master element from which the, or each, access request originated when the access requests do not match, thereby enabling the system to react properly on such an error condition. For example, the configuration logic 370 may generate an access error signal, provided for within the system bus functionality.

As previously mentioned, for the embodiment illustrated in FIG. 3, the RAM routing logic 210 comprises comparator logic 380, operably coupled to the read ports of each memory element. Accordingly, in a case of read operations from the memory elements 340, 345, when the RAM routing logic 210 is providing redundant memory storage as illustrated in FIG. 4, the comparator logic 380 compares the information read from the memory elements 340, 345. If the information does not match, an error has occurred in one or both of the memory elements, and a corresponding indication is returned to the configuration logic 370. Accordingly, upon detection of such an error, the configuration logic 370 may cause an error message, for example an access error signal within the system bus functionality, to be returned to the bus master elements from which the read requests were received.

Furthermore, by adding error detection (EDC) or error detection and correction (ECC) elements to the read port of every memory element 340, 345, the embodiment illustrated in FIG. 3 is capable to not only detect, but also correct, detected errors. The corresponding functionality is described later when discussing FIG. 11. Such a configuration provides enhanced availability by correcting the most common error classes when providing redundant memory storage, and may further provide enhanced availability by using the same ECC elements to protect the corresponding memory element.

Figure 5:
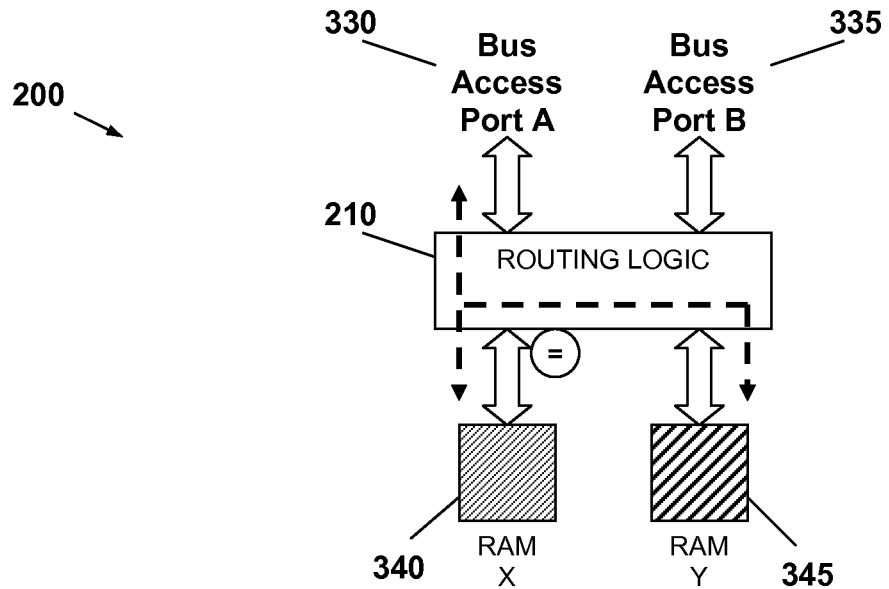

Referring now to FIG. 5, there is illustrated the RAM routing logic 210 configured to support concurrent access to the two memory elements 340, 345 via one bus access port, Port 'A' 330, to access redundantly stored data. For example, two bus master elements, such as CPUs 120, may be configured to operate independently, thus enabling the available operating performance thereof, of Port 'A' 330, to be doubled. In this configuration, no redundancy is provided for bus master resources, or redundancy may be provided by other means than concurrent bus master accesses. However, redundant storage of data in duplicated memory resources is provided, thereby providing a high safety level at least for the data being stored in memory.

For the operation illustrated in FIG. 5, a single access request is received by the RAM routing logic 210 at bus access Port 'A' 330; in this example the second bus access Port 'B' 335 is not used or might be performing another operation. Since in this example the RAM routing logic 210 is providing redundant memory, it will subsequently perform concurrent accesses to the two memory elements 340, 345. For this purpose, when operating to provide redundant memory storage in this manner, the RAM routing logic 210 replicates access requests to both memory elements 340, 345; and the result of read requests to both memory elements 340, 345 may be validated to match to ensure the integrity of the data retrieved.

Referring back to FIG. 3, when the RAM routing logic 210 is operating to provide redundant memory storage as illustrated in FIG. 5, when an access request is received on Port 'A' 330, the configuration logic 370 configures WMUX 350 and WMUX 355 to couple respectively the output of Port 'A' 330 to both Memory 'X' 340 and Memory 'Y' 345. In this manner, when a write request is received at Port 'A' 330, WMUX 350 and WMUX 355 route the write request to both memory elements 340 and 345 respectively. Thus, information is written to both memory elements, providing redundancy thereof. Conversely, when a read request is received on Port 'A' 330, the configuration logic 370 configures WMUX 350 and WMUX 355 to couple the output of Port 'A' 330 to the memory elements 340 and 345 respectively. As a result, both memory elements 340 and 345 provide the requested data on their respective read ports.

The configuration logic 370 may validate that the data provided by both memory elements 340 and 345 at the respective read port is equivalent by evaluating the comparison result provided by the comparator logic 380. When the data matches, the configuration logic couples the read port of one memory element 340, 345 to the RMUX associated with the bus access port that has provided the original request by a bus master; for this particular example the bus access port 'A' 330 and the RMUX 360. If the data does not match, an error has occurred in one or both of the memory elements, and a corresponding indication is returned by the comparator logic 380 to the configuration logic 370. The configuration logic 370 can then provide an error status related to the original bus access request, thereby enabling the system to react properly on such an error condition.

Furthermore, by adding error detection (EDC) or error detection and correction (ECC) elements to the read port of every memory element 340, 345, the embodiment illustrated in FIG. 3 is capable to not only detect errors, but also correct detected errors. The corresponding functionality is described later when discussing FIG. 11. Such a configuration will provide enhanced availability by correcting the most common error classes when providing redundant memory storage, and may further provide enhanced availability by using the same ECC elements to protect the corresponding memory element.

Figure 6:
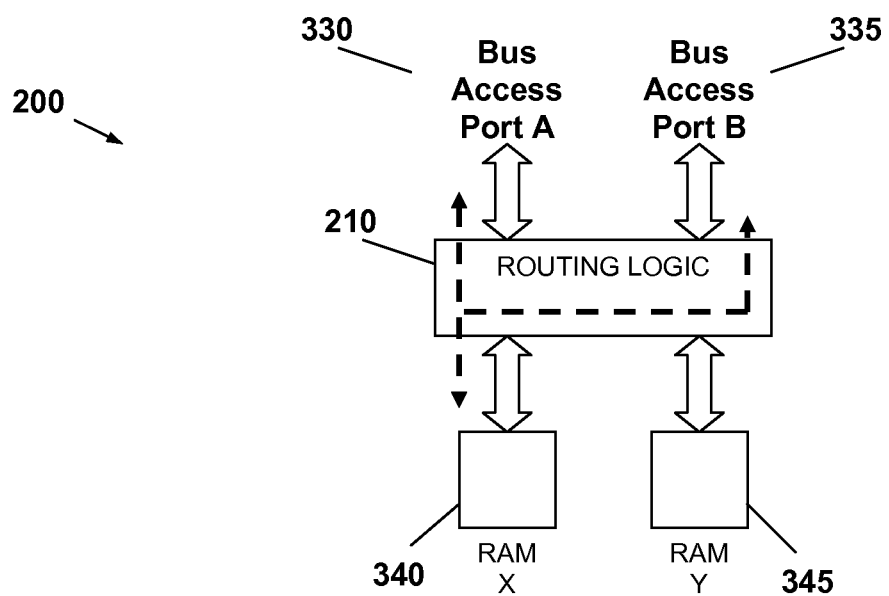

Referring now to FIG. 6, there is illustrated the RAM routing logic configured to support concurrent equivalent access to the memory elements 340, 345 via the two bus access ports, Port 'A' 330 and Port 'B' 335, in order to access non-redundantly stored data. For example, bus master elements, such as CPUs 120, may be configured to operate in 'lock-step' mode, whereby the master elements perform equivalent operations, cross-checking each other's operations. Thus, concurrent accesses are performed via the two respective bus access ports 330, 335, in a similar manner to the system configuration illustrated in FIG. 4, whereby redundancy may be provided for both bus master resources. However, contrary to the configuration illustrated in FIG. 4, for the configuration illustrated in FIG. 6 no redundancy is provided for the memory resources, thereby providing a high safety level for the system whilst enabling memory resources to operate independently.

For the operation illustrated in FIG. 6, the RAM routing logic 210 concurrently receives separate but equivalent read and write requests for the memory elements 340, 345, via the bus access ports, Port 'A' 330 and Port 'B' 335. Both access requests may be validated to ensure they are equivalent, and the corresponding access is then routed by the RAM routing logic 210 to the appropriate memory element, which for the particular example illustrated in FIG. 6 is the Memory X 340. Since the data is not stored redundantly, the application can fully exploit the resources provided by both memory elements, resulting in double the amount of memory locations than would be available in case of complete redundant storage.

Referring back to FIG. 3, when the RAM routing logic 210 is operating to provide non-redundant memory storage in a redundantly working system as illustrated in FIG. 6, the configuration logic 370 may validate that the access requests received at both bus access ports 330 and 335 are equivalent, and accordingly provide an error status when they do not match, thereby enabling the system to react properly on such an error condition. When the access requests do match, the configuration logic 370 selects one of WMUX 'X' 350 or WMUX 'Y' 355 to operably couple the output of one of Port 'A' 330 or Port 'B' 335 to the appropriate memory element 340, 345, depending on to which memory element the request address relates.

Thus, for the example illustrated in FIG. 6, when a write request relates to an address space in Memory 'X' 340, the configuration logic 370 configures WMUX 'X' 350 to operably couple the output of, say, Port 'A' 330 to the memory element 'X' 340. In this manner, although two write access requests are received concurrently on both access ports 330, 335, because these requests are substantially identical, due to the redundant operation of the bus master elements, the information is only written to memory 'X' 340 once.

Similarly, for the example illustrated in FIG. 6, when a read request is received concurrently at Port 'A' 330 and at Port 'B' 335, the configuration logic 370 configures one of WMUX 'X' 350 to operably couple the output of, say, Port 'A' 330 to the selected memory element 'X' 340. In this manner, although two read requests are received concurrently on both access ports 330, 335, only one read request is routed to the appropriate memory element. The configuration logic 370 then configures both RMUX 'A' 360 and RMUX 365 to operably couple the read port of the appropriate memory element, for the example illustrated in FIG. 6, memory element 'X' 340, to the input of their respective access port 330, 335. In this manner, although the requested information is only read once from a single memory element, it is returned via both access ports 330, 335, thus providing the read information to both bus master elements requesting the data.

Figure 7:
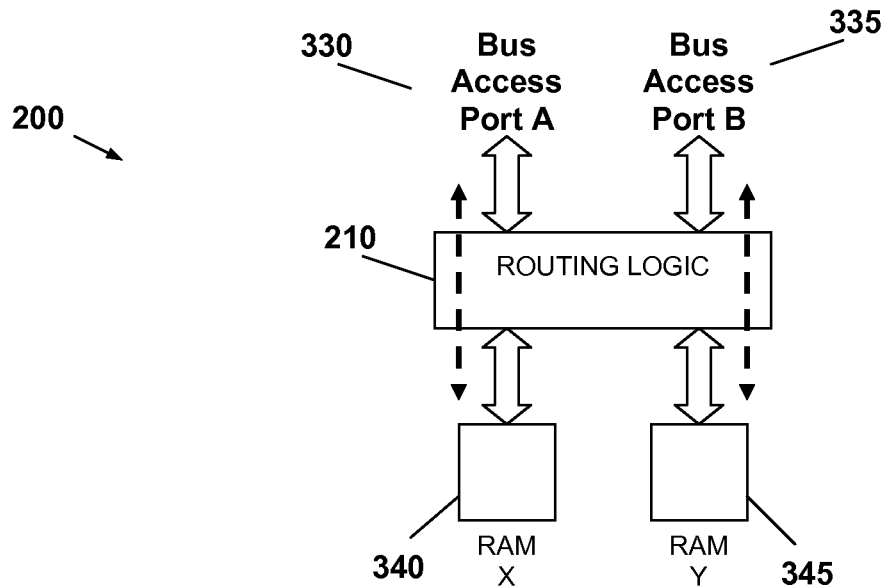

Referring now to FIG. 7, there is illustrated the RAM routing logic 210 configured to support concurrent independent access to the two memory elements 340, 345 via the two bus access ports, Port 'A' 330 and Port 'B' 335, to access non-redundantly stored data. For example, bus master elements, such as CPUs 120, may be configured to operate independently; any access to memory resources is then using a single bus access port. Access to the memory elements 340, 345 is concurrently being provided via both access ports 330, 335 to maximise the overall performance of the system. In this mode, no redundancy is provided for bus master resources, nor is redundant storage of data in duplicated memory resources provided; thus maximizing the computation performance and the random access memory (RAM) size available to the application.

For the operation illustrated in FIG. 7, independent access requests are received by the RAM routing logic 210 at both bus access Port 'A' 330 and Port 'B' 335. The RAM routing logic 210 identifies the memory element (RAM) 340, 345 selected by a particular access request and checks for potential access conflicts.

In a case where there is no conflict, for example with the access request on each bus access Port 'A' 330 and 'B' 335 relating to memory resources provided by different memory elements 340, 345, the RAM routing logic 210 forwards the request to the corresponding memory element 340, 345. By way of example, the access request on Port 'A' 330 relates to memory resource provided by memory 'X' 340, and the access request on Port 'B' 335 relates to memory resource provided by memory 'Y' 345, as illustrated in FIG. 7, or vice versa.

Conversely, a conflict occurs when access requests received on the two bus access port 'A' 330 and Port 'B' 335 relate to memory resources provided by the same memory element; either in memory element 'X' 340 or in memory element 'Y' 345. In accordance with some embodiments of the invention, when such a conflict occurs, the RAM routing logic 210 may delay one of the access requests, as described further below.

Referring back to FIG. 3, when the RAM routing logic 210 is operating to provide non-redundant memory storage in a system performing independent bus master accesses. As illustrated in FIG. 7, the configuration logic 370 determines which memory element 340, 345 is addressed by a particular access request on bus access port 'A' 330 and Port 'B' 335. When there is no conflict or a single access request, it configures WMUX 'X' 350, WMUX 'Y' 355, RMUX 'A' 360 and RMUX 'B' 365 to operably couple the outputs and inputs of Port 'A' 330 and Port 'B' 335 as required for each access request received.

For example, when a write request is received at Port 'A' 330 comprising an address relating to Memory 'X' 340, the configuration logic 370 configures WMUX 'X' 350 to operably couple the output of Port 'A' 330 to the write port of Memory 'X' 340, thereby routing the write request to Memory 'X' 340. Conversely, when a read request is received at Port 'B' 335 comprising an address relating to Memory Y 345, the configuration logic 370 configures WMUX 'Y' 355 to operably couple the output of Port 'B' 335 to the write port of Memory 'Y' 345, thereby routing the read request to Memory 'Y' 345. The configuration logic 370 also configures RMUX 'B' 365 to operably couple the read port of Memory 'Y' 345 to the input of Port 'B' 335, thereby routing the requested data back to Port 'B' 335. In this manner, the memory resources provided by the two memory elements 340, 345 are used substantially independently, without any redundancy.

Referring back to FIG. 3, and in accordance with some embodiments of the invention, the RAM routing logic 210 may comprise First-In-First-Out (FIFO) buffers, such as FIFO buffers 390 operably coupled between outputs of each bus access Port 'A' 330 and Port 'B' 335, and the write multiplexers WMUX X 350 and WMUX Y 355. Each FIFO buffer 390 is further coupled to, and controlled by, the configuration logic 370. In this manner, each FIFO buffer 390 is controllable by the configuration logic 370 such that the configuration logic is able to delay an access request by arranging an appropriate FIFO buffer 390 to 'record' data associated with the access request to be delayed, for example in order to avoid a conflict between two consecutive access requests to the same memory element.

For example, in a case where the RAM routing logic 210 is operating in a system that uses non-redundant accesses, as illustrated in FIG. 5 or FIG. 7 and as described earlier, whereby concurrent independent accesses to the two memory elements 340, 345 are supported via the two respective bus access ports 330, 335, concurrent independent access requests may be received on the two bus access ports 330, 335 relating to the same memory element 340, 345. Similar operations apply to cases where a redundant access on Port 'A' 330 requires access to both memory elements 340, 345, but a second access on Port 'B' 335 also requires access to memory element 340 and/or memory element 345. Accordingly, in order to avoid an access conflict, one of these access requests may be recorded by a FIFO buffer 390, and delayed by one or more bus clock cycles.

Write requests received at a bus access port can be delayed by recording them in a FIFO buffer without affecting the system functionality; in contrast to delaying a read request, which would stall the system until the read result can be made available. Therefore, read requests may be given priority over write requests in order to minimise latency in responding to requests from bus master elements. In this manner, a conflict where a write access request is involved may be resolved, whilst reducing negative effects of delayed accesses to the overall system. However, where read requests and write requests are received that relate to the same address in memory, the read and write actions should be performed in the correct order in order to ensure that the correct information is returned to the bus master element request information to be read.

For the embodiment illustrated in FIG. 3, each FIFO buffer 390 is operably coupled to the same inputs of write multiplexers WMUX 'X' 350 and WMUX 'Y' 355 as its respective bus access Port, using a multiplexer (not shown) to select either its output or the output of the FIFO. In this manner, each write multiplexer WMUX 'X' 350 and WMUX 'Y' 355 for the illustrated embodiments may comprise a 2:1 multiplexer, enabling the configuration logic 370 to select one of bus access Port 'A' 330/Port 'A' FIFO buffer 390 or bus access Port 'B' 335/Port 'B' FIFO buffer 390.

In accordance with some alternative embodiments of the inventions, it is contemplated that each FIFO buffer 390 may alternatively be operably coupled to its own discrete input of each write multiplexer. In this manner, each write multiplexer WMUX X 350 and WMUX Y 355 for the illustrated embodiment would comprise a 4:1 multiplexer, enabling the configuration logic 370 to select one of bus access Port 'A' 330, Port 'A' FIFO buffer 390, bus access Port 'B' 335, or Port 'B' FIFO buffer 390.

In accordance with some further alternative embodiments, FIFO buffers may alternatively or additionally be operably coupled between the outputs of the write multiplexers WMUX 'X' 350 and WMUX 'Y' 355 and the write ports of the memory elements 340 and 345, as illustrated by FIFO buffers 395 in FIG. 3. In this case, another multiplexer (not shown) could be used to select either the output of the corresponding WMUX or the output of the FIFO for usage at the write port of the memory element. In this manner, a recorded write access request may be (further) delayed for a particular memory element 340 and/or 345, thus further reducing possible access conflicts.

As will be appreciated, the RAM routing logic 210 hereinbefore described with reference to the illustrated embodiments supports a configurable trade-off between redundant storage of information in two or more memory elements or using these memory elements as standalone, independent storage areas in systems configured having independent or redundant memory accesses. As will also be appreciated, redundant storage of information is achieved by writing the same data concurrently in two memory elements. In particular, for the embodiments hereinbefore described, the RAM routing logic 210 has been described as distributing available memory resource by arranging the memory elements to provide redundant memory storage as a whole, or to provide non-redundant memory storage as a whole. However, it is contemplated that the RAM routing logic may be arranged to distribute the available memory resource within each memory element, as well as between each memory element.

Figure 8:
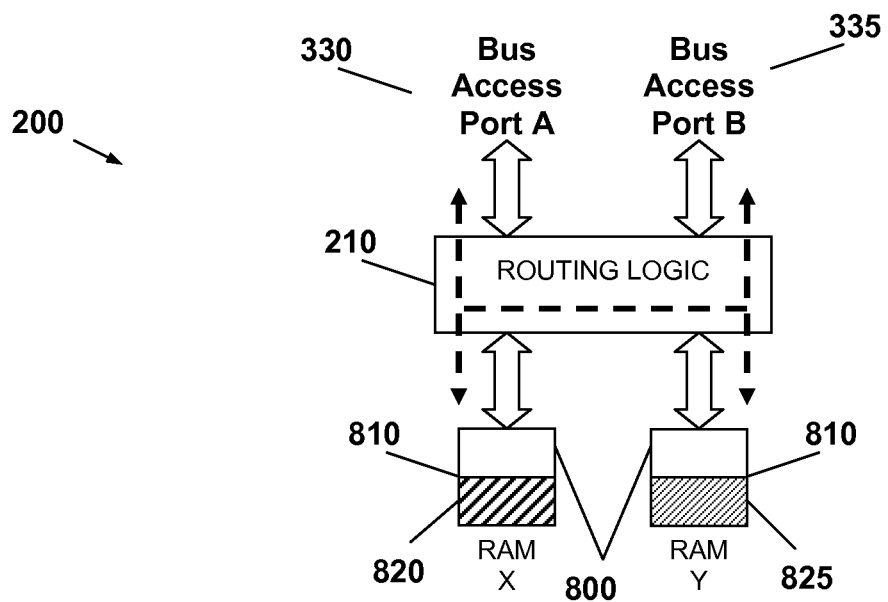

Referring now to FIG. 8, there is illustrated the RAM routing logic 210 adapted to provide redundant and non-redundant memory storage within the two memory elements 340, 345, via both bus access ports 330, 335. The RAM routing logic 210 may receive either redundant access requests on bus access Port 'A' 330 and bus access Port 'B' 335, or independent accesses requests on both bus access ports. When it receives redundant access requests, the RAM routing logic 210 may operate to provide redundant memory storage as described in FIG. 4 or provide non-redundant memory storage as described in FIG. 6. Conversely, when RAM routing logic 210 receives independent access requests, the RAM routing logic 210 may operate to provide redundant memory storage as described in FIG. 5 or provide non-redundant memory storage as described in FIG. 7.

For the embodiment illustrated in FIG. 8, the content of a register (not shown) may be used to identify whether redundant or non-redundant memory should be accessed; any address below a certain address limit value 810 being used to access non-redundant memory area 800, while any address above this address being used to access redundant memory areas 820 and 825. As will be appreciated by a skilled artisan, many other criteria and a different order are also possible to be used as criteria to distinguish redundant from non-redundant accesses.

For the system incorporating the RAM routing logic 210, the described operations simulate the existence of a non-redundant memory area 800, and two memory areas 820 and 825 that are working as a redundant memory area, where the content of the memory area 820 is redundantly mirrored in the memory area 825. The criteria for storing data into the redundant or non-redundant area is fully controlled by the configuration logic 370 within the RAM routing logic 210, and can be modified by software, for example by altering the corresponding register via register access port 375. Thus, a configurable ratio between redundant and non-redundant memory storage may be provided for memory resources, thereby enabling the RAM routing logic 210 to be configured to provide a required performance to safety ratio.

Figure 9:
FIG. 9 illustrates an example of pseudo code for implementing the configuration of RAM routing logic illustrated in FIG. 8.

Referring now to FIG. 9, there is illustrated an example of high level pseudo code 900 that may be used for implementing the RAM routing logic 210 illustrated in FIG. 8. This pseudo code shows the two bus access ports operating concurrently; in particular a left hand column 910 of the pseudo code implementing the bus access Port 'A' 330 and associated logic, while a right hand column 920 of the pseudo code implements the bus access Port 'B' 335 and associated logic. Upon receipt of an access request on Port 'A' 330, the left hand column 910 of the pseudo code 900 is executed. Conversely, and concurrently, if an access request is received on Port 'B' 335, the right hand column 920 of the pseudo code 900 is executed.

Accordingly, upon receipt of a request on bus access Port 'A' 330 or Port 'B' 335, the address in memory to which the request relates is compared to an address limit value 810 stored in, for example, a register of the configuration logic 370. For the illustrated embodiment, this address limit value 810 divides the memory resource within each memory element into redundant memory storage and non-redundant memory storage areas. For example, the address limit value 810 may represent an address value above which the memory space within each memory element 340, 345 comprises a redundant memory area 820 and 825, respectively, and below which the memory space within each memory element 340, 345 comprises a non-redundant memory area 800.

If the address to which the request relates has a value larger than the address limit value, the access request relates to redundant memory storage. For access requests relating to redundant memory storage, if the request is for write access, the information is written to both memory elements 340, 345 at the appropriate address in each memory element. The notation denotes a parallel operation performed by the pseudo-code. Conversely, if the request is for a read access, the information is read from both memory elements 340, 345. The information from the two memory elements 340, 345 may then be compared to validate the information, before being forwarded to the requesting bus master element(s).

If the address to which the request relates has a value less than or equal to the address limit value, the access request relates to non-redundant memory storage. For access requests relating to non-redundant memory storage, if the request is for a write access, the information is written to the non-redundant memory space of the appropriate memory element 340, 345. For example, the addressing for the two memory elements 340, 345 may be divided such that even addresses relate to Memory X 340 whilst odd addresses relate to Memory Y 345. In this manner, the least significant bit of an address may be used to differentiate between the two memory elements 340, 345, with the remaining address bits defining an address within the relevant memory element(s). Conversely, if the request is for a read access, the information is read from the appropriate memory element, and forwarded to the requesting bus master element.

As mentioned above, in a case of access requests relating to the non-redundant memory area, the least significant bit may be used to identify which of the memory elements 340, 345 the request is intended for, and the remaining address bits identify the relevant address within the memory element. Accordingly, in the case where the request relates to redundant memory storage, the least significant bit may be ignored, since the request relates to both memory elements, with the remaining address bits defining the relevant address within each memory element.

In this manner, the RAM routing logic 210 may permit a configurable distribution of the total available memory into a first area of memory storing the information redundantly, and a second area of memory storing the information non-redundantly. All data written into the first area of (redundant) memory may be stored concurrently into two locations within different and separated memory blocks, while the data written into the second area of (non-redundant) memory is only written into a single memory location. Consequently the size of the total available memory (TAM) is distributed into redundant memory having an address space size (RM) and a non-redundant memory having an address space size (NRM), whereby:

$$(TAM)=2\times(RM)+(NRM).$$

Furthermore, a distribution ratio of available memory between redundant and non-redundant storage may be configured with a fine granularity of one data word by way of modifying an address value to be used for the address limit value, and may be configured by software, for example via a register access port provided by the configuration logic 370 upon device/system reset, device/system start-up, program start-up, or even during program run-time. The resulting flexibility enables a substantially optimum usage of the available memory size by an individual application, and permits later modifications of this configuration to take into account bug fixes, additional functionality or other code changes during the lifetime of the application. Furthermore, the use of an address to differentiate between redundant and non-redundant memory areas is particularly advantageous for software engineers developing application code that utilise such RAM routing logic due to its close relationship to the way a software compiler and linker application works. This permits a simple and very intuitive usage of the capabilities of the RAM routing logic by software engineers.

A person skilled in the art will appreciate that the RAM routing logic hereinbefore described provides the capability to perform multiple, concurrent accesses which are often required by systems employing multiple bus masters working in parallel. This is especially true in cases where these accesses are requesting data from the non-redundant portion of the accessed memories, which is stored in different memory blocks. Only cases where different accesses are addressing the same memory block require some priority scheme to solve the arising access conflict.

Figure 10:
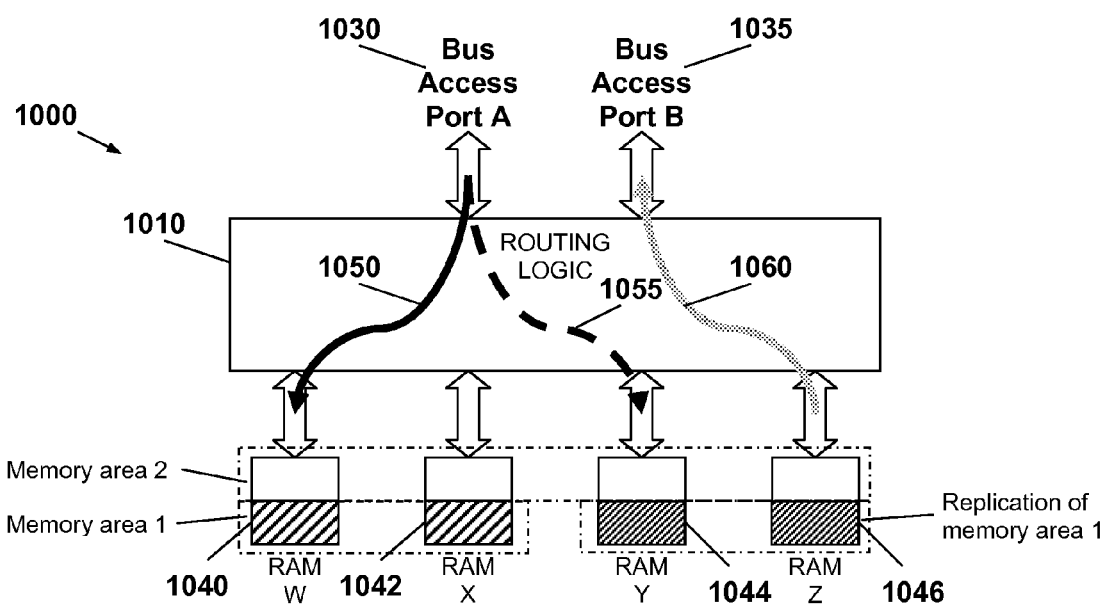
FIG. 10 illustrates another example of a system for distributing available memory resource.

FIG. 10 illustrates a system 1000 for distributing available memory resource according to some alternative embodiments of the invention. The system 1000 comprises four random access memory (RAM) elements 1040, 1042, 1044, 1046, and RAM routing logic 1010 arranged to dynamically distribute the available memory resource into a first memory area providing redundant memory storage and a second memory area providing non-redundant memory storage. The RAM routing logic 1010 is operably coupled to two bus access ports 1030, 1035 of, for example, a crossbar switch or other communication element via which master elements may access the RAM elements 1040, 1042, 1044, 1046. In a similar manner as the aforementioned embodiments for addressing two memory blocks, whereby the least significant bit of the address may be used to distinguish between the two memory blocks, the two least significant bits of the address may be used to distinguish between four memory blocks.

For the illustrated embodiments, the only requirement on the underlying storage medium is the availability of at least two independent memory blocks for storing the corresponding data. However, using more than two independent memory blocks, for example as illustrated in system 1000, will further enhance the capability to perform concurrent accesses by multiple bus masters, even in cases where redundant accesses are running in parallel. This is due to the fact that only multiple access requests to the same memory block may not be performed concurrently. Thus, increasing the number of memory blocks will decrease the chance for such collisions.

FIG. 10 illustrates this with an example where an access request to the redundant memory area is performed via bus access Port 'A' 1030, while a second access request to the non-redundant memory area is performed by bus access Port 'B' 1035. The access on Port 'A' 1030 requests data from RAM 1040 and 1044, while the access on Port 'B' 1035 requests data from RAM 1046. Since there is no access to the same memory block, both accesses can be performed concurrently.

It is contemplated that providing more than two internal storage elements that can be accessed in parallel by the routing logic will reduce the chance of conflicting accesses and thus enhance the capability to respond to multiple accesses by different masters concurrently. Furthermore it is possible to delay write accesses such that a concurrent read access takes precedence, resulting in no visible delay for both requesting bus masters. The write access can then be finished at a later cycle.

Figure 11:
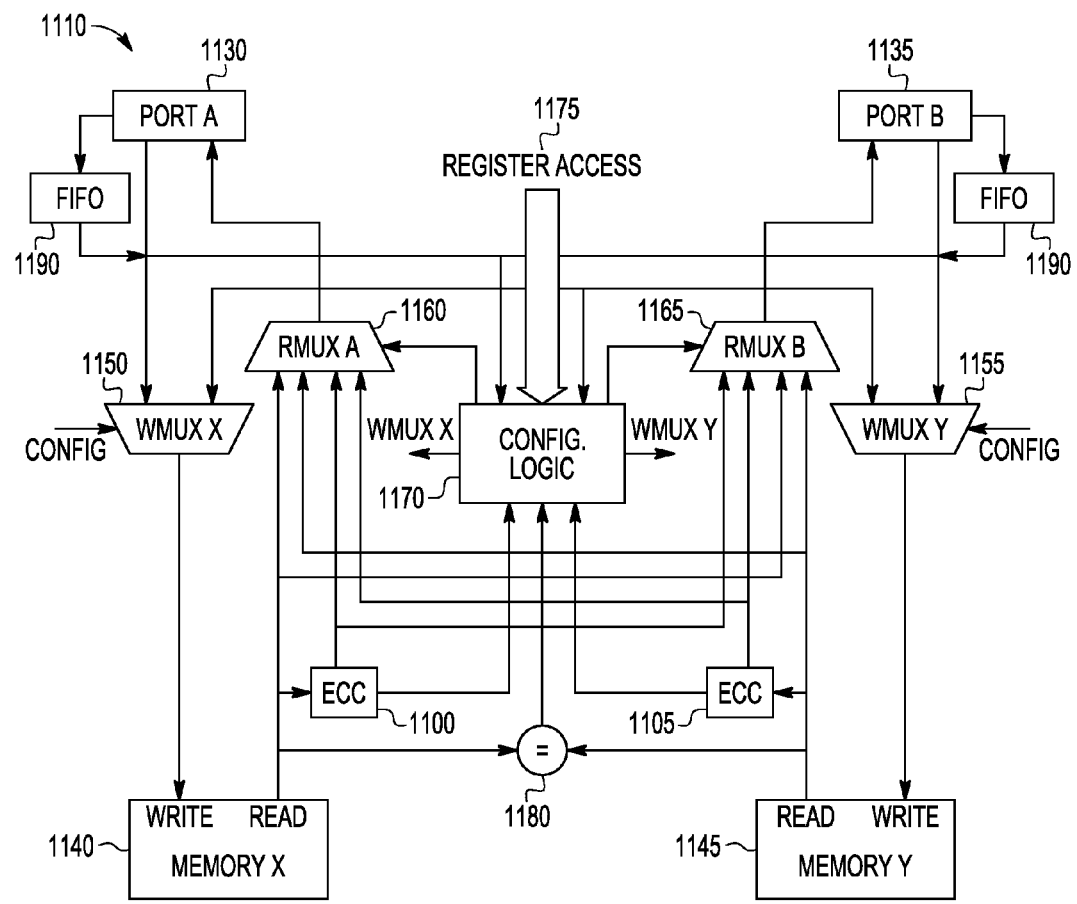
FIG. 11 illustrates another example of RAM routing logic.

Referring now to FIG. 11, there is illustrated RAM routing logic 1110 supporting two Bus Access Ports and two random access memory (RAM) elements according to some embodiments of the invention, which is an enhanced version of the embodiment described in FIG. 3 providing increased availability. For the embodiment illustrated in FIG. 11, the RAM routing logic 1110 is operably coupled to a first bus access port, Port 'A' 1130, and a second bus access port, Port 'B' 1135, of a communication element, such as a crossbar switch or the like. The RAM routing logic 1110 is further operably coupled to two memory elements, Memory 'X' 1140 and Memory 'Y' 1145.

The RAM routing logic 1110 comprises two write multiplexers, WMUX 'X' 1150 and WMUX 'Y' 1155. An output of each of the write multiplexers, WMUX 'X' 1150 and WMUX 'Y' 1155, is operably coupled to a write port of one of the memory elements, Memory 'X' 1140 and Memory 'Y' 1145 respectively. In this manner, the RAM routing logic 1110 comprises a write multiplexer for each memory element coupled thereto. An output of each of the bus access ports, Port 'A' 1130 and Port 'B' 1135, is operably coupled to an input of each write multiplexer, WMUX 'X' 1150 and WMUX 'Y' 1155. The FIFO elements 1190 can be used to delay write accesses in case of conflicting accesses to maximize throughput.

The RAM routing logic 1110 further comprises two read multiplexers, RMUX 'A' 1160 and RMUX 'B' 1165. An output of each of the read multiplexers, RMUX 'A' 1160 and RMUX 'B' 1165, is operably coupled to an input of one of the bus access ports, Port 'A' 1130 and Port 'B' 1135 respectively. In this manner, the RAM routing logic 1110 comprises a read multiplexer for each bus access port coupled thereto. A read port of each of the memory elements, Memory 'X' 1140 and Memory 'Y' 1145, is operably coupled to an input of each read multiplexer, RMUX 'A' 1160 and RMUX 'B' 1165.

The RAM routing logic 1110 comprises configuration logic 1170 arranged to dynamically distribute available memory resource into a first memory area providing redundant memory storage and a second memory area providing non-redundant memory storage. Accordingly, for the embodiment illustrated in FIG. 11, the configuration logic 1170 is operably coupled to, and arranged to control the configuration of, each of the read multiplexers, RMUX 'A' 1160 and RMUX 'B' 1165, and the write multiplexers, WMUX 'X' 1150 and WMUX 'Y' 1155. The configuration logic 1170 is further operably coupled to the outputs of the bus access ports, Port 'A' 1130 and Port 'B' 1135, and arranged to receive memory access request information therefrom. In this manner, the configuration logic 1170 receives information relating to access requests, such as read and write requests, received on Port 'A' 1130 and Port 'B' 1135, and is able to dynamically configure the multiplexers 1150, 1155, 1160, 1165 in response to received access requests, and in accordance with, for example, an operating mode in which the RAM routing logic 1110 has been configured to operate. For this purpose, the behaviour of the configuration logic 1170 may be controlled by software, for example by altering internal registers (not shown) within the configuration logic 1170 via the register access port 1175.

For the illustrated embodiment, the RAM routing logic 1110 further comprises comparator logic 1180, operably coupled to the read ports of the memory elements, and arranged to compare information accessed from the memory elements. An output of the comparator logic 1180 is provided to the configuration logic 1170. In this manner, the comparison logic 1180 is able to provide an indication to the configuration logic 1170 in response to determining that the comparison of accessed information does not yield a match.

The RAM routing logic 1110 further comprises error detection and correction (ECC) logic 1100 and 1105, operably coupled to the read ports of the memory elements and arranged to validate the read results provided by the memory elements. An output of the ECC logic 1100 and 1105 is operably coupled to the RMUX 'A' 1160 and RMUX 'B' 1165, enabling them to also select read results corrected by these elements. Furthermore, the ECC logic 1100 and 1105 is connected to the configuration logic 1170 capable of providing error and status information for any access to the memory elements 1140 and 1145.

For the normal, failure-less operation, every element of the RAM routing logic 1110 in FIG. 11 behaves exactly like the corresponding element of the RAM routing logic in FIG. 3. Only in a case of reading erroneous information from one or both of the Memory 'X' 1140 and Memory 'Y' 1145, does the enhanced error detection and correction capabilities of this particular embodiment become visible.

When the memory elements 1140 and 1145 are configured to store data non-redundantly, the ECC logic 1100 and 1105 provides standard ECC detection and correction capabilities for the corresponding memory element, as will be the case for any standalone memory having ECC protection.

When the memory elements 1140 and 1145 are configured to store data redundantly, the ECC logic 1100 and 1105 in combination with the RAM routing logic, and especially the comparator logic 1180 and the configuration logic 1170, provide enhanced error detection capabilities and a significantly enhanced availability. When working in this mode, the configuration logic 1170 exploits information from the comparator logic 1180 and the ECC logic 1100 and 1105 to identify erroneous data and determine whether it will be possible to correct the erroneous data. If the data read from the redundant storage blocks 1140, 1145 does not match, an error has occurred in one or both of the memory elements, and a corresponding indication is returned by the comparator 1180 to the configuration logic 1170. The configuration logic 1170 can then select correct data based on the status information received from the ECC logic 1100 and 1105 and the comparator logic 1180. In cases where both memory elements 1140, 1145 have provided erroneous data, but at least one of two data values could be corrected by the ECC logic 1100 and 1150, the configuration logic 1170 is capable to also select this corrected value and will therefore still provide the correct data value to the requestor.

Accordingly, when reading redundantly stored information, the information retrieved from both memory elements 1140 and 1145 is compared by comparator logic 1180. In this manner, the comparator logic 1180 provides a means of validating data read from the two memory elements 1140, 1145, relative to one another. Although the embodiment in FIG. 11 illustrates a direct connection between the read ports of the memory and the ECC units 1100, 1105 and comparator logic 1180, it is envisaged that in alternative embodiments an indirect connection may be used, say via another element or component. Concurrently, the data and its corresponding ECC information is provided to the ECC components 1100, 1105 coupled to the corresponding memory element 1140, 1145. The ECC components 1100, 1105 then perform ECC checking on the data, and ECC information is used to detect, and if possible correct, any errors that may have occurred during conveyance or storage of the data. In this manner, the ECC components 1100, 1105 provide additional safety features for data stored within memory.

As previously mentioned, the ECC components 1100, 1105 are arranged to detect, and if possible correct, errors within information read from the memory elements 1140, 1145. However, as will be appreciated, not all errors can be corrected using such ECC components. Nevertheless, when the RAM routing logic 1110 is configured to provide concurrent access to the two memory elements 1140, 1145 providing redundant memory storage, the comparator logic 1180 is able to detect when information read from the memory elements does not match. Accordingly, when the information read does not match, the ECC components 1100, 1105 are capable of detecting which information is erroneous.

Consequently, even if the ECC components 1100, 1105 are unable to correct the data in error, the configuration logic 1170 is able to identify which of the redundantly stored information is error free (or can be corrected in case of a single bit error), and thereby route that information back to the requestor. Accordingly, unless errors that can not be corrected are detected within both sets of read information, the RAM routing logic 1110 is able to effectively correct information comprising any number of bit errors detected in one of the memory elements when configured to provide concurrent access to the two memory elements 1140, 1145 providing redundant memory storage.

Using this unique capability to combine the error checking capabilities of two different error prevention methodologies, redundant storage and ECC checking, the RAM routing logic is able to detect many more errors than any state-of-the-art methodology. It is further capable to correct the most common error cases in a simple and effective manner, thus providing an enhanced availability without compromising the error detection features. In this manner, further safety combined with enhanced availability is provided with respect to the storage and retrieval of information within a system configured to provide redundant memory storage.

Aspects of the invention may be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a compact disc read only memory (CD-ROM) or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

As used herein, the term 'bus' is used to refer to a plurality of signals or conductors which may be used to transfer one.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans will appreciate that conductivity types and polarities of potentials may be reversed.

Moreover, the terms 'front,' 'back,' 'top,' 'bottom,' 'over,' under and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Also for example, in one embodiment, the illustrated elements of system 200 are circuitry located on a single integrated circuit or within a same device. Alternatively, system 200 may include any number of separate integrated circuits or separate devices interconnected with each other. For example, memory elements 340, 345 may be located on a same integrated circuit as RAM routing logic 210 or on a separate integrated circuit or located within another peripheral or slave discretely separate from other elements of system 200. Also for example, system 200 or portions thereof may be soft or code representations of physical circuitry or of logical representations convertible into physical circuitry. As such, system 200 may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements, for example, from computer readable media. Such computer readable media may be permanently, removably or remotely coupled to an information processing system. The computer readable media may include, for example and without limitation, any number of the following: magnetic storage media including disk and tape storage media; optical storage media such as compact disk media (e.g., compact disc read only memory (CD-ROM), compact disc recordable (CD-R), etc.) and digital video disk storage media; nonvolatile memory storage media including semiconductor-based memory units such as FLASH memory, electrically erasable read only memory (EEPROM), erasable read only memory (EPROM), read only memory (ROM); ferromagnetic digital memories; magnetoresistive read only memory (MRAM); volatile storage media including registers, buffers or caches, main memory, RAM, etc.; and data transmission media including computer networks, point-to-point telecommunication equipment, and carrier wave transmission media, just to name a few.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

Also, devices functionally forming separate devices may be integrated in a single physical device. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A system comprising:
a first bus master element and a second bus master element;

a first random access memory (RAM) element;
a second random access memory (RAM) element; and
RAM routing logic comprising a first bus access port coupled to the first bus master element, a second bus access port coupled to the second bus master element, a third bus access port coupled to the first RAM element, and a fourth bus access port coupled to the second RAM element;
in response to the first and the second bus master elements being configured to operate in a redundant mode of operation with respect to each the RAM routing logic adapted to:
concurrently receive a first memory access request at the first bus access port from the first bus master element and a second memory access request at the second bus access port from the second bus master element, the first and second memory access requests being equivalent;
determine whether the first memory access request and the second memory access request are requests to access one of the first or second RAM element non-redundantly, or both of the first and second RAM elements redundantly;
in response to determining that the first and second memory access requests are requests to access the first and second RAM elements redundantly, the RAM routing logic to redundantly access the first and second RAM elements;
in response to determining that the first and second memory access requests are requests to access one of the first or second RAM element non-redundantly, the RAM routing logic to non-redundantly access only one of the first and second RAM elements.

2. The system of claim 1, wherein the RAM routing logic determines whether the first and second memory access requests are to access the first and second RAM elements redundantly based on a memory address of the access requests.

3. The system of claim 1, wherein the RAM routing logic determines whether the first and second memory access requests are to access the first and second RAM elements redundantly based on comparing a memory address of the access requests to a configurable parameter.

4. The system of claim 1 wherein:
in response to the first and second bus master elements being configured to operate in a non-redundant mode of operation with respect to each other, the RAM routing logic adapted to:
receive a third memory access request at the first bus access port from the first bus master element;
determine whether the third memory access request is to access the first or second RAM element non-redundantly, or is to access the first and second RAM elements redundantly;
in response to the third memory access request being a request to access the first and second RAM elements redundantly, the RAM routing logic to redundantly access the first and second RAM elements; and
in response to the third memory access request being a request to access the first or second RAM element non-redundantly, to non-redundantly access only one of the first and second RAM elements.

5. The system of claim 4, wherein the RAM routing logic is further adapted to:
concurrent with the third memory access request, receive a fourth memory access request at the second bus access port from the second bus master element; and determine whether the fourth memory access request is to access the first or second RAM element non-redundantly, or is to access the first and second RAM elements redundantly; and
in response to the third memory access being a request to access the first RAM element non-redundantly and the fourth memory access being a request to access the second RAM element non-redundantly, concurrently access both the first RAM element and the second RAM element.

6. The system of claim 4, further comprising:
a first-in-first-out (FIFO) buffer coupled to the first bus access port;
wherein in response to the first and second bus master elements being configured to operate in a non-redundant mode of operation with respect to each other, the RAM routing logic is further adapted to:
concurrent with the third memory access request, receive a fourth memory access request at the second bus access port from the second bus master element, wherein the third memory access request and the fourth memory access request are write requests; and
in response to the third memory access request being a request to access the first RAM element non-redundantly and the fourth memory access request being a request to access the first RAM element non-redundantly, the RAM routing logic to store data associated with the third memory access request in the FIFO buffer and access the first RAM element non-redundantly using data associated with the fourth memory access request.

7. The system of claim 4, wherein:
in response to the first and the second bus master elements being configured to operate in a redundant mode of operation with respect to each other, the RAM routing logic is further adapted to:
compare an access property of the first memory access request and an access property of the second memory access request; and
output an indication based on the comparison of the access properties.

8. The system of claim 7, wherein the indication is based upon a comparison of a write value of the first memory access request to a write value of the second memory access request.

9. The system of claim 1, further comprising:
error detection/correction logic arranged to detect errors within information accessed from the first RAM element and from the second RAM element.

10. The system of claim 9, wherein in response to redundantly accessing the first and second RAM elements, the RAM routing logic is further adapted to:
detect, via the error detection/correction logic, an uncorrectable error in only one of a first data value of the first memory access request and a second data value of the second memory access request; and
provide the data value of the memory access not having the uncorrectable.

11. A method comprising:
receiving at a RAM routing logic a first memory access request from a first bus master element and a second memory access request from a second bus master element;
in response to determining that the first bus master element and the second bus master element are configured to operate in a redundant mode of operation with respect to each other, and in response to determining the first memory access request and the second memory access request are concurrently received equivalent access requests:
  determining whether the first memory access request and the second memory access request are requests to access redundant memory or to access non-redundant memory;
  in response to determining that the first and second memory access requests are requests to access redundant memory, redundantly accessing the first and second RAM elements; and
  in response to determining the first and second memory access requests are requests to access non-redundant memory, non-redundantly accessing only one of the first and second RAM elements.

12. The method of claim 11, wherein determining whether the first and second memory access requests are requests to access redundant memory is based on a memory address of the first and second memory access requests.

13. The method of claim 11, wherein determining whether the first and second memory access requests are requests to access redundant memory based on comparison of a memory address of the access requests to a configurable parameter.

14. The method of claim 11, further comprising:
  in response to determining that the first bus master element and the second bus master element are configured to operate in a non-redundant mode of operation with respect to each other, determining whether the first memory access request is a non-redundant memory access request to one of the first or second RAM element, or whether the first memory access request is a redundant memory access request to both of the first and second RAM elements;
  in response to the first memory access request being a redundant memory access request, accessing the first and second RAM elements redundantly; and
  in response to the first memory access request being a non-redundant memory access request, non-redundantly accessing only one of the first and second RAM elements.

15. The method of claim 11, wherein the first and second memory access requests are received at the RAM routing logic concurrently, and said method further comprises:
  in response to determining that the first bus master element and the second bus master element are configured to operate in a non-redundant mode of operation with respect to each other: determining whether the first memory access request is a non-redundant access request to one of the first or second RAM element, or whether the first memory access request is a redundant access request to both of the first and second RAM elements; and determining whether the second memory access request is a non-redundant access request to one of the first or second RAM element, or whether the second memory access request is a redundant access request to both of the first and second RAM elements; and
  in response to determining that the first memory access request is a request to access the first RAM element non-redundantly and that the second memory access request is a request to access the second RAM element non-redundantly, concurrently non-redundantly accessing both the first RAM element and the second RAM element.

16. The method of claim 11, wherein the first and second memory access requests are received at the RAM routing logic concurrently, and said method further comprises:
  in response to determining the first bus master element and the second bus master element are configured to operate in a non-redundant mode of operation with respect to each other: determining whether the first memory access request is a non-redundant access request to one of the first or second RAM element, or whether the first memory access request is a redundant access request to both of the first and second RAM elements; and determining whether the second memory access request is a non-redundant access request to one of the first or second RAM element, or whether the second memory access request is a redundant access request to both of the first and second RAM elements; and
  in response to determining that the first memory access request is a request to access the first RAM element non-redundantly and that the second memory access request is a request to access the first RAM element non-redundantly, concurrently non-redundantly recording data associated with the first memory access request in a first-in-first-out buffer and accessing the first RAM element using data associated with the second memory access request.

17. The method of claim 11, wherein:
  in response to determining the first bus master element and the second bus master element are configured to operate in a redundant mode of operation with respect to each other,
    comparing an access property of the first memory access request and an access property of the second memory access request; and
    outputting an indication based on the comparison of the access properties.

18. The method of claim 17, wherein the access property of the first and second memory access requests is a write data value, and the indication indicates whether the write data values of the first and second memory access requests do or do not match.

19. The method of claim 11, further comprising:
  detecting errors within information accessed from the first RAM element and from the second RAM element.

20. The method of claim 11, wherein said method further comprises:
  in response to the first and second access requests being equivalent redundant read access requests, providing a first data value read from the first RAM element in response to detecting an uncorrectable error in a second data value read from the second RAM element and not detecting an uncorrectable error in the first data value read from the first RAM element.

* * * * *